United States Patent
Wang

(10) Patent No.: US 7,042,257 B2
(45) Date of Patent: May 9, 2006

(54) FREQUENCY DIVIDER WITH REDUCED JITTER AND TRANSMITTER BASED THEREON

(75) Inventor: Zhenhua Wang, Zurich (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 20 days.

(21) Appl. No.: 10/487,640

(22) PCT Filed: Aug. 22, 2002

(86) PCT No.: PCT/IB02/03444

§ 371 (c)(1),
(2), (4) Date: Feb. 24, 2004

(87) PCT Pub. No.: WO03/019781

PCT Pub. Date: Mar. 6, 2003

(65) Prior Publication Data

US 2004/0202275 A1    Oct. 14, 2004

(30) Foreign Application Priority Data

Aug. 29, 2001    (EP) .................................. 01120554

(51) Int. Cl.
*H03K 21/00* (2006.01)
(52) U.S. Cl. .................... 327/115; 327/117; 377/47
(58) Field of Classification Search ............. 327/114, 327/115, 117–120; 377/47, 48, 119, 126
See application file for complete search history.

(56) References Cited

U.S. PATENT DOCUMENTS

| | | | | |
|---|---|---|---|---|
| 3,902,125 A | * | 8/1975 | Oliva, Jr. | 377/108 |
| 4,443,887 A | * | 4/1984 | Shiramizu | 377/110 |
| 4,545,257 A | * | 10/1985 | Tomita | 73/861.17 |
| 5,065,415 A | * | 11/1991 | Yamashita | 377/52 |
| 5,132,642 A | * | 7/1992 | Bush et al. | 331/1 A |
| 6,108,393 A | * | 8/2000 | Opsahl | 377/47 |
| 6,480,070 B1 | * | 11/2002 | Locher | 331/17 |
| 6,504,407 B1 | * | 1/2003 | Park et al. | 327/115 |
| 6,750,686 B1 | * | 6/2004 | Wang | 327/115 |
| 6,760,397 B1 | * | 7/2004 | Wu et al. | 377/47 |
| 6,842,054 B1 | * | 1/2005 | Wang | 327/115 |

* cited by examiner

*Primary Examiner*—Kenneth B. Wells
*Assistant Examiner*—An T. Luu
(74) *Attorney, Agent, or Firm*—Adam L. Stroud

(57) ABSTRACT

An apparatus for generating an output signal whose frequency is lower than the frequency of an input signal is disclosed. The apparatus includes a chain of frequency dividing cells where each cell has a definable division ratio. Furthermore, the frequency dividing cells include a clock input for receiving an input clock, a divided clock output for providing an output clock to a subsequent frequency dividing cell, a mode control input for receiving a mode control input signal from the subsequent frequency dividing cell, and a mode control output for providing a mode control output signal to a preceding frequency dividing cell. The apparatus may further includes a logic network having one or more inputs where each input is connected to a mode control input of one of the frequency dividing cells.

16 Claims, 9 Drawing Sheets

FREQUENCY DIVIDER WITH REDUCED JITTER AND TRANSMITTER BASED THEREON

The present invention concerns frequency dividers and apparatus for frequency division. More particularly, this invention relates to a frequency divider architecture and circuit technique based on the zipper divider architecture being well suited for use in transmitters, in particular for radio frequency signal transmission. Also concerned are transmitters without modulators.

Great efforts have been made in radio frequency (RF) design towards one-chip transceivers in standard complementary metal oxide semiconductor (CMOS) in recent years. Particularly the CMOS implementation of frequency dividers and frequency synthesizers—one of the key building blocks in a transmitter—have attracted a lot of attention. The most notable trend here is the zipper divider architecture and the so-called current-mode logic (CML).

The known zipper divider is comprised of a chain of divide-by-2/3 cells of identical circuitry. Shown in FIG. 1 is a conventional divide-by-2/3 cell 10 having five terminals 11–15: clock input (CKin) 11, divided clock output (CKout) 12, mode control input (MDin) 13, mode control output (MDout) 14, and a programming input (P) 15. Each divide-by-2/3 cell 10 consists of two circuit blocks: a prescaler logic block 16 which divides either by 2 or 3, controlled by a swallow signal (SW) generated by another block called end-of-cycle logic 17. When a programming bit P=0 (with MDin=1 or MDin=0) is applied at the programming input 15, then the cell 10 divides by 2 and when P=1 and MDin=1 it divides by 3.

The divide-by-2/3 cells are typically implemented in CML. An elementary CML logic circuit comprises several stacked differential pairs, two resistive or active loads, and one tail current source. Further details concerning CML implemented zipper dividers is described by C. Vaucher and Z. Wang in "A low-power truly-modular 1.8 GHz programmable divider in standard CMOS technology", ESS-CIRC'99. pp. 406–409, 1999, and by C. Vaucher, I. Ferencic, M. Locher, S. Sedvallson, U. Voegeli, and Z. Wang in "A family of low-power truly modular programmable dividers in standard 0.35-mm CMOS technology", IEEE J. Solid-State Circuits SC-35, No. 7, pp. 1039–1045, 2000.

An example of a known frequency divider 20 comprising a chain of six divide-by-2/3 cells 21–26 and an input latch 27 is depicted in FIG. 2A. Implemented in CMOS, the divider 20 is capable of operating at an input clock frequency (CK1) in the GHz range. FIG. 2B shows the terminal signals of the frequency divider 20. The clock input and clock output signals (CK1–CK7) are depicted in the plots on the left hand side of FIG. 2B and the mode control signals (MD1–MD6) are depicted on the right hand side together with CK1. The amplitudes of the clock input and clock output signals (CK1–CK7) range in the present example between −500 mV and +500 mV (peak-to-peak) since the divider 20 is realized in CML. In the present example, for most of the time, the cells 21–26 divide their respective clock input by 2. If the division ratio is 3, the pulse width is wider, as visible on the left hand side of FIG. 2B. In case of the signal CK3, for example, at the times t1 and t2 the division ratio is 3. This is due to the fact that a binary word P=111111 is applied to the programming inputs (P0–P5) of the input latch 27. If the programming inputs are always logic "1" the division ratio of the individual cells 21–26 is only determined by the mode control signal (MD) issued by a subsequent cell to a preceding cell.

For low-power applications, a divider architecture capable of reducing the power consumption by up to 50% has been proposed in the co-pending patent application entitled "Improved frequency divider with reduced power consumption, apparatus based thereon, and method for power efficient frequency division". This co-pending patent application was filed on 22 Dec. 2000 is currently assigned to the assignee of the present patent application. Application number 00128322.5 was assigned.

A novel reclocking and a novel frequency divider architecture with double-reclocking are presented in the co-pending patent application entitled "Improved frequency divider with reduced jitter and apparatus based thereon". This co-pending patent application was filed on 17 May. 2001 is currently assigned to the assignee of the present patent application. Application number 01112125.8 was assigned. The novel architecture and technique presented in this patent application is based on the known zipper divider architecture.

A modulator 31 has long been an indispensable component of a transmitter 30. It modulates the carrier frequency by the data to be transmitted, as shown in FIG. 3, where the carrier frequency (fo) is generated by a phase-locked-loop (PLL) 32.

By contrast, the state-of-the-art transmitters 40 tend to exploit the fractional-N PLL transmitter, where a PLL 41 is used not only for the generation of the carrier frequencies (fo) but also for the modulation. In such transmitters 40, the traditional analog modulator is replaced by an adder 42 and a sigma/delta ($\Sigma/\Delta$) modulator 43, as depicted in FIG. 4. Both are favorably digital.

The fractional-N divider is the key component in this transmitter 40. It comprises a frequency divider 44 with integer division ratio (DR) and the $\Sigma/\Delta$ modulator 43, which controls the DR and randoms the phase error. The control data (Pi) of the frequency divider 44 contain the information of both the data to be transmitted and the carrier frequency (fo) to control the modulus of the divider 44.

At GHz range and above, the before mentioned zipper divider architecture and CML technique have proven to be the first choice for low-power. If the divider 44 is to be implemented in zipper architecture and CML technique, a number of problems will be encountered when the various parts of the transmitter 40 of FIG. 4 are being connected. These include the output pulse width, output jitters, the reference duty cycle, and the timing constraints, etc. Some of the issues are even contradictory in nature.

Jitter, for example, is a major concern in frequency divider and transmitters because introducing even a small jitter into these circuits leads to dramatic changes in its frequency spectrum and timing properties, thus resulting in lower signal-to-noise ratio, increased bit error rates, and higher interference to neighboring channels. Jitter is also important in clocked and sampled data systems because the zero-crossing often contain information so any uncertainties in switching instants will cause error.

Until now, the output pulse width and jitter in particular are not seriously considered when designing zipper divider circuitry in CML and when designing transmitters employing such zipper dividers.

It is thus an objective of the present invention to improve current divider circuitry and transmitters.

It is another objective of the present invention to provide a frequency divider with reduced or eliminated output jitter.

It is another objective of the present invention to provide a frequency divider with an output pulse width that is wide enough for properly feeding a phase frequency detector being part of a transmitter, to identify the timing constraints, and to show a simple way to address the issue.

A novel frequency divider architecture with a logic network is presented herein. The novel architecture and technique is based on the known zipper divider architecture. It allows to provide an output signal having the desired pulse width and low jitter.

An apparatus, according to the present invention, is claimed in claim 1.

Various advantageous embodiments are claimed in claims 2 through 9.

An apparatus according to the present invention is particularly well suited for use in a transmitter, without the need of a modulator. A transmitter in accordance with the present invention is claimed in claim 10.

Various advantageous embodiments of the transmitter are claimed in claims 11 through 16.

The frequency divider architecture provided herein allows reducing or eliminating jitters of different kinds of circuits, and in particular asynchronous circuits like the zipper divider circuits. Devices according to the present invention are very effective and robust.

Various embodiments are proposed herein to achieve the best performances.

The most salient benefits of the embodiments presented herein include a comparatively spurious free output spectrum with very low levels of phase noise close to the carrier, and considerable reduction of the manufacturing costs.

The fractional-N PLL transmitters according to the present invention are well suited for use in transceivers and other devices.

Other advantages of the present invention are addressed in connection with the detailed embodiments.

For a more complete description of the present invention and for further objects and advantages thereof, reference is made to the following description, taken in conjunction with the accompanying drawings, in which.

For sake of simplicity, certain of the signal lines in the various Figs. are shown as single ended signal lines. In reality, many of the signals are differential, meaning that there are in fact two signal lines. Other signals may be digital signals that are several bits wide. Where necessary for a better understanding of the invention, the width of the digital signal is indicated. The indicated signal width is application/embodiment specific.

The pulse width of a frequency divider's output signal (fdiv) and the jitter are two contradictory issues. Depending on the circuitry in which the frequency divider is employed, the jitter of the output signal (fdiv) and the pulse width is to be considered.

Figure 1:
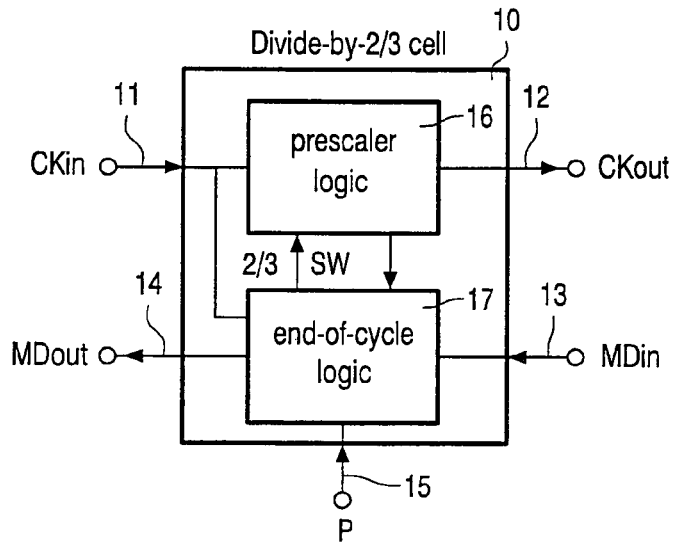
FIG. 1 is a conventional divide-by-2/3 cell comprising two logic blocks.
Figure 2A:
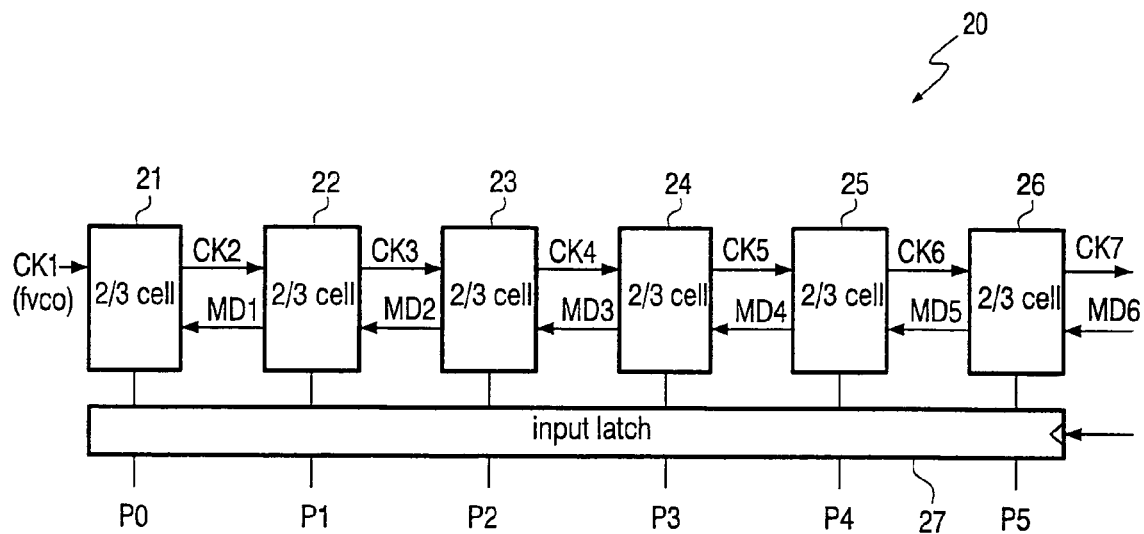
FIG. 2A is a conventional zipper divider architecture comprising six divide-by-2/3 cells.
Figure 2B:
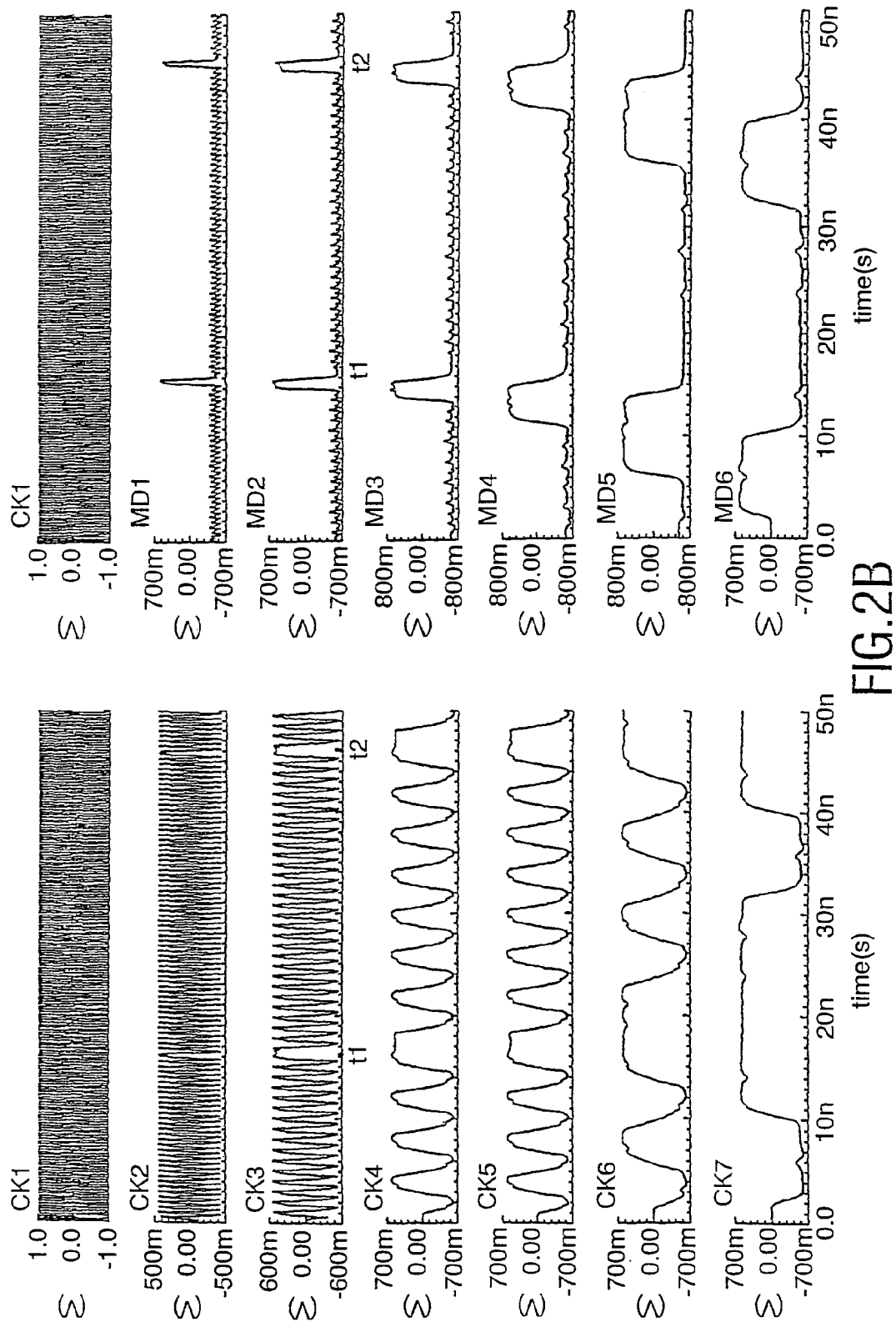
FIG. 2B is a diagram depicting the clock signals and mode control signals of the conventional zipper divider architecture of FIG. 2A.
Figure 3:
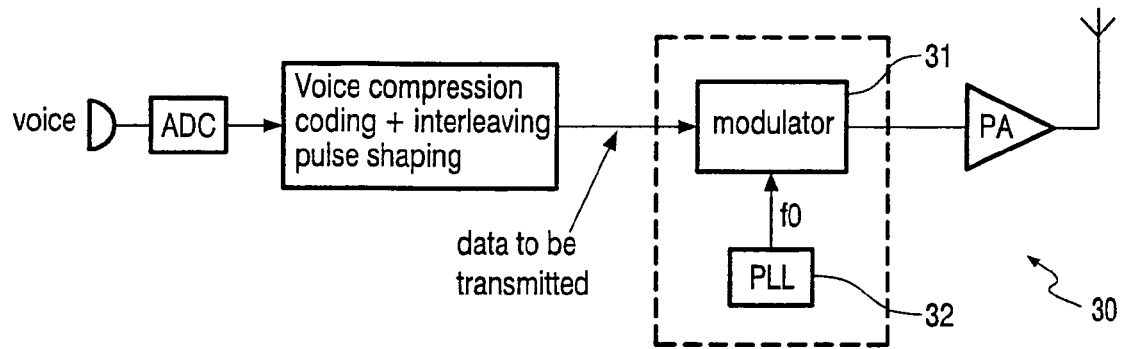
FIG. 3 is a schematic representation of a conventional transmitter/transceiver that comprises a modulator.
Figure 4:
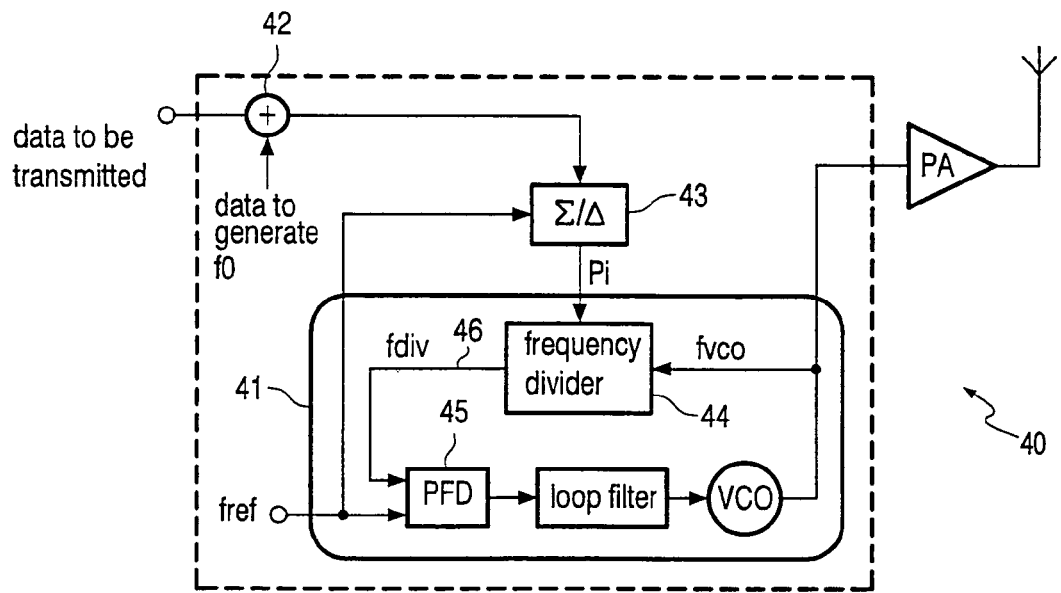
FIG. 4 is a schematic representation of a popular fractional-N PLL transmitter.

For a zipper divider any signal among MDi may serve as the output because they all have the same frequency but different pulse width, as clearly seen from FIG. 2B for example. There are also different sizes of the associated jitters, which are not visible in the waveforms shown. As the pulse width of MDi changes with index i, it is possible to choose a MDi wide enough to meet the requirement. However, for low-power the current consumption is scaled down cell-by-cell, and at the same time the load resistance is scaled up to maintain the gain of the divider cell. Hence, the wider the pulse width of MDi is, the larger the associated jitter will be. Furthermore, due to the asynchronous nature of this type of frequency divider, jitters accumulate along the signal path cell by cell. Therefore, amongst MD1 to MD6, the signal at MD1 has the smallest jitter but unfortunately the narrowest pulse width, and the signal at MD6 has the widest pulse width but the largest jitter. For these reasons, wider output pulse width and lower output jitters are contradictory issues in the design.

The solution proposed and described herein allows to generate the desired pulse width with the lowest possible jitter. According to the present invention, this is achieved by combining several consecutive MDi signals, including MD1, by an appropriate logic circuit. Preferably, an OR gate is employed as logic circuit.

Figure 5:
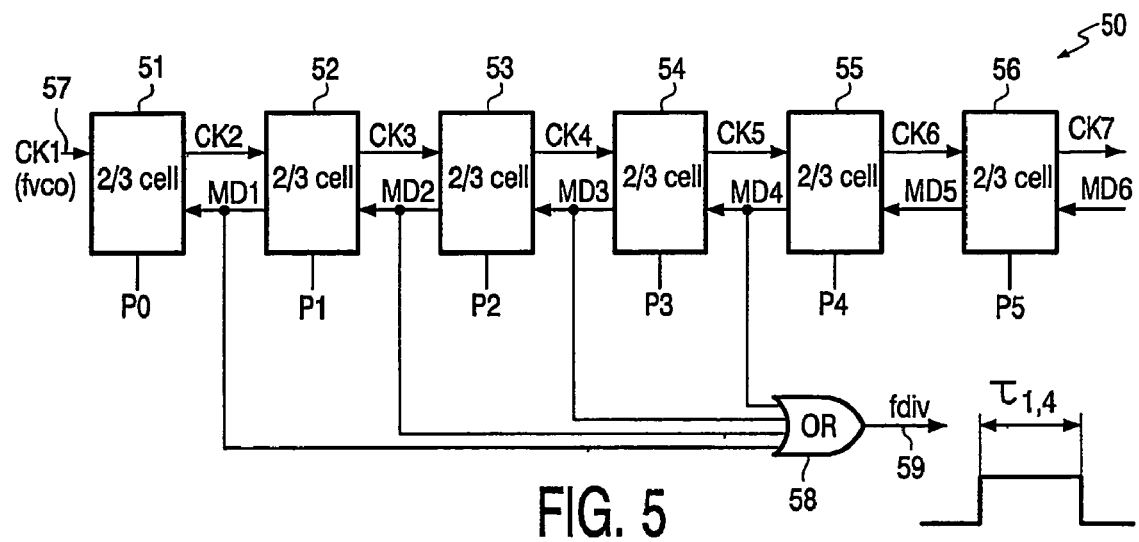
FIG. 5 is a schematic representation of a frequency divider with OR-gate, in accordance with the present invention.

FIG. 5 shows a first frequency divider 50, in accordance with the present invention. It comprises in the present example six divide-by-2/3 cells 51–56 in a chain. The frequency divider 50 generates an output signal (fdiv) whose frequency is lower than the frequency of an input signal (fvco) being applied to the input (CK1) 57 of the cell 51. The frequency dividing cells 51–56 have a pre-defined division ratio (N). In the present example the cells are divide by-2/3 cells, where N=2 or N=3. Each of the cells 51–56 comprises five terminals. Note that in the first cell 51 of the chain only four of the terminals are used. The first terminal serves as a clock input for receiving an input clock (CKin); one terminal is a divided clock output for providing an output clock (CKout) to a subsequent frequency dividing cell, one terminal is a mode control input for receiving a mode control input signal (MDin) from the subsequent frequency dividing cell, and another one of the terminals is a mode control output for providing a mode control output signal (MDout) to a preceding frequency dividing cell. In the present example, an input clock signal fvco is applied to the terminal (CK1) 57 of the first cell 51. This input signal fvco is processed in order to generate an output signal fdiv having a lower frequency than the input signal fvco.

According to the present invention, the frequency divider 50 further comprises a logic network for combining several of the signals at the mode control inputs. In the present embodiment, the logic network comprises an OR-gate 58 having m inputs (m=4 in the present embodiment). Each of the m inputs is connected to a mode control input MD1, MD2, MD3 and MD4 of one of m consecutive frequency dividing cells 51, 52, 53, 54. Several consecutive MDi signals (MD1, MD2, MD3 and MD4), including MD1, are combined by the OR-gate 58. An output signal (fdiv) is made available at an output 59 of the OR-gate 58. The output signal (fdiv) at the output 59 has a pulse width $\tau_{1,4}$ that is wider than the widest pulse width of any of the mode control input signals MD1, MD2, MD3 or MD4 at the m inputs of the OR-gate 58. By ORing the first MD1 to MDi signals of the six-stage zipper divider 50 of FIG. 5, the resultant pulse width $\tau_{1,4}$ is wider than any of the OR-gate's m input signals.

Figure 6:
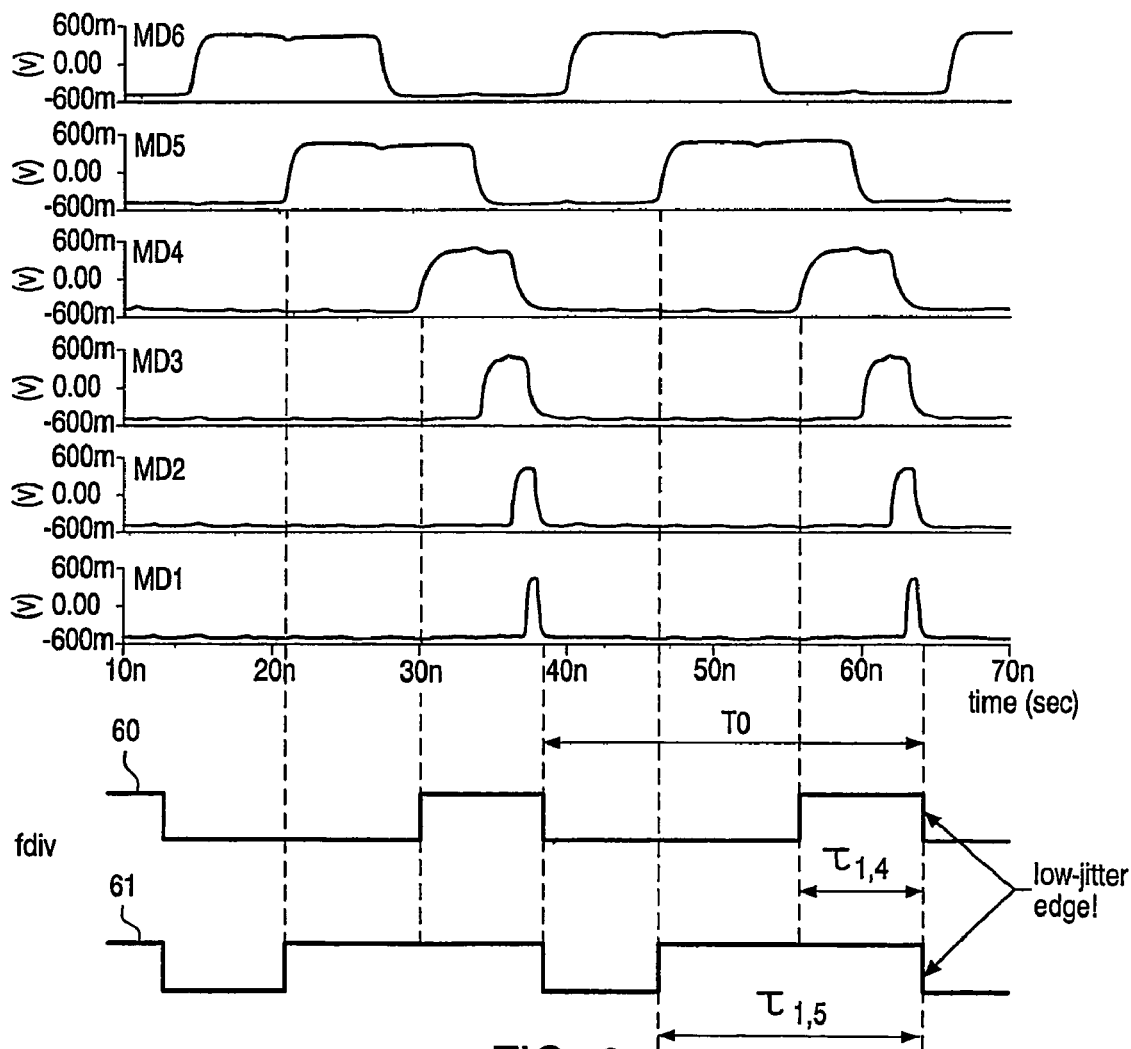
FIG. 6 is a diagram depicting the signals of the frequency divider of FIG. 5.

In the upper part of FIG. 6 the MDi signals of the frequency divider 50 are shown, where i=1, 2 . . . 6. At the bottom of FIG. 6, the output signal (fdiv) 60 is shown. The pulse width $\tau_{1,4}$ of the output signal (fdiv) 60 is wider than the width of any of the pulses of the signals MD1, MD2, MD3 or MD4.

Another output signal (fdiv) 61 is shown at the bottom of FIG. 6. The pulse width $\tau_{1,5}$ of the output signal (fdiv) 61 is wider than the width of any of the pulses of the signals MD1, MD2, MD3, MD4 or MD5. The output signal (fdiv) 61 can be obtained by feeding the signals at MD1 through MD5 to an OR-gate with five inputs, for example.

Using an appropriate equation, one can show that with the kind of arrangement shown in FIG. 6 the resultant pulse width is wider than the pulse width any of the input signals. This finding guides the design of further embodiments, as will be shown below. One can calculate the pulse width of an output signal (fdiv) resulting from any combination of the signals MDi. FIG. 6 shows two cases, each with different pulse widths: $\tau_{1,4}$, $\tau_{1,5}$.

The width $\tau_{1,x}$ of the output signal fdiv depends on the division ratio (DR) of the frequency divider. For a n-stage zipper divider, the available range of its DR are: $\gamma_{min}=2^n$ and $\gamma_{max}=2^{n+1}-1$, where $\gamma$ is the division ratio.

Figure 7:
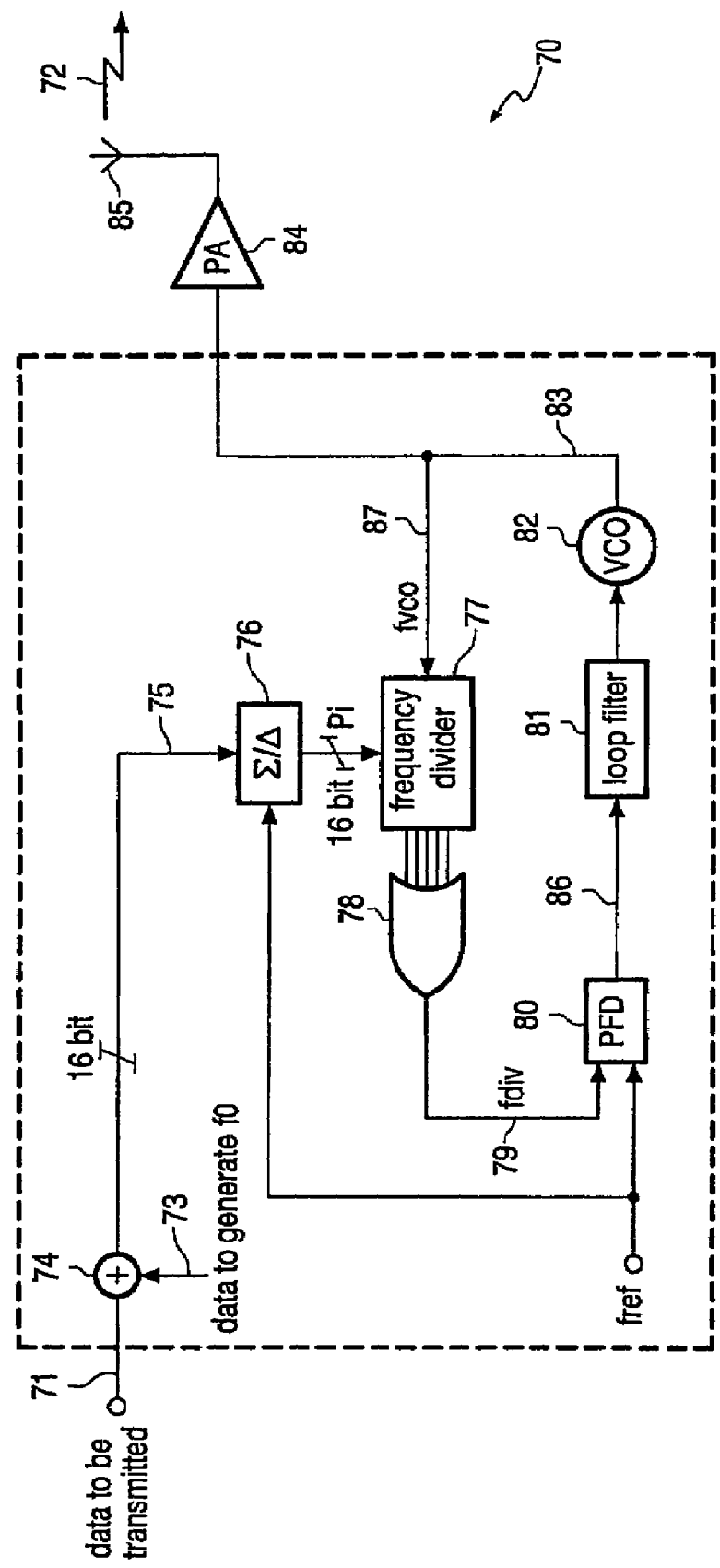
FIG. 7 is a schematic representation of a fractional-N PLL transmitter, according to the present invention, comprising a frequency divider with OR-gate.

A transmitter 70, in accordance with the present invention, is illustrated in FIG. 7. In the present example, the transmitter 70 is realized in CMOS technology. It comprises a first data input 71 for data to be transmitted by the transmitter 70 across a channel 72. A second data input 73 is provided. Data applied to this second data input 73 enable a carrier frequency (f0) to be selected. The first data input 71 and the second data input 73 are fed into adder 74 providing a digital signal (herein referred to as modulating data) by adding the data to be transmitted and the data identifying the carrier frequency (f0). In the present embodiment, the modulating data are 16 bits wide. They are applied to an input 75 of a $\Sigma/\Delta$ modulator 76 (also called S/D-modulator) that processes the digital signal to generate a binary code word (Pi) allowing together with mode control input signals (MDin) the actual division ratio (N) of a zipper divider 77 to be switched. The zipper divider 77 allows integer division ratios, which, together with the $\Sigma/\Delta$-modulator 76, constitutes a fractional-N divider. In the present embodiment, the binary code word (Pi) is 6 bits wide since the zipper divider 77 has six divide-by-2/3 cells (not shown in FIG. 7). The zipper divider 77 is connected to a logic network providing at its output 79 an output signal (fdiv). In the present embodiment, the logic network comprises an OR-gate 78. The transmitter 70 further comprises a phase frequency detector (PFD) 80 for processing the output signal (fdiv) and a reference signal (fref). The phase frequency detector (PFD) 80 generates an error signal at output 86 based on comparing the input signal fref and the PLL feedback signal fdiv.

In the present embodiment, the phase frequency detector (PFD) 80 is followed by a loop filter 81 and a voltage controlled oscillator (VCO) 82. The voltage controlled oscillator (VCO) 82 provides an output signal (fvco) at an output 83. The input data at input 75 contain the information (input data) of both the signal to be transmitted via a communication channel 72 and the carrier frequency (fo) to control the modulus of the zipper divider 77. As a result, the output signal fvco at the output 83 of the voltage-controlled oscillator (VCO) 82 is a modulated radio-frequency (RF) signal at the desired carrier frequency (fo). The transmitter 70 further comprises a power amplifier (PA) 84 and an antenna 85 through which the modulated radio-frequency (RF) signal is emitted into the channel 72. The VCO 82 output signal fvco at output 83 is used to generate the PLL feedback signal fdiv. For this purpose, the output signal fvco is fed to an input 87 of the zipper divider 77.

When the reference frequency is kept constant, which is normally the case, changing $\gamma$ results in a VCO frequency proportional to $\gamma$. It follows that for i=n the available minimum output pulse width of the output signal (fdiv) is approximately equal to 1/0.5 fref, half the period of the reference frequency fref, and the attainable maximum output pulse width $\gamma=\gamma_{min}$ approaches the period of fref.

When the output signal (fdiv) of the frequency divider 77 is fed to the phase frequency detector (PFD) 80, the PFD 80 needs some time to react. For proper operation of the PFD 80, its input pulse width at the input 79 must not be too narrow. On the other hand, output jitter has to be minimized. When the PFD 80 is edge triggered—which is normally the case—the jitter at the triggering edge is to be considered. The two input signals fref (a stable reference signal) and fdiv of the PFD 80 do not need to have the same duty cycle.

The above proposed circuit technique to generate wider pulse width, for example, the one shown in FIG. 5 with i=4, or the one shown in FIG. 7 with i=5, is very simple and robust, and the output signal fdiv is free of glitches thanks to the overlap between consecutive MDi signals. Since MD1 is included when combining the mode control input (MDi) signals at the OR-gate 78, lowest possible jitter on the failing edges can be obtained if the OR-gate 78 is a low-jitter design. Similarly, modifying the logic network by replacing the OR-gate 78 by a NOR-gate results in lowest possible jitter on the rising edges.

For proper operation of the frequency dividers in a PLL, according to the present invention, particularly for fractional-N division ratios, it is most important that the frequency divider 77 divides correctly under the control of the $\Sigma/\Delta$ modulator 76. As the division ratio of the frequency divider 77 is controlled by data Pi, it is absolutely critical to know the timing constraints for the data Pi.

To avoid a complex and tedious timing analysis, an alternative approach is adopted here. For the sake of simplicity and clarity, one may first consider the simplest case in which the division ratio is an integer and constant. The result of this analysis is given in FIG. 8. From the design of the zipper divider 77 it can be concluded that for correct operation the control bits P0–P5 are only allowed to change during time interval Tx, shown in FIG. 8, and they must be stable and kept unchanged during the rest of that output cycle To. Having gained the knowledge about the timing of the control bits Pi, one can consider next what timing relationship between Pi and fref/fdiv is required. As the PFD 80 is required to sense the phase difference between fref and fdiv on the falling edges for the present embodiment, the falling edge of fdiv should be the one directly derived from MD1. This is shown in FIG. 8 by the dashed line 90.

When the PLL is locked, both input signals fdiv and fref of the PFD 80 will have the same frequency and the same phase, and the falling edge 91 and 92 of fref and fdiv will be aligned for a constant division ratio. Because the control data Pi are provided by the Σ/Δ modulator 76 and the Σ/Δ modulator 76 is clocked by fref (see FIG. 7), it is preferred to have the Σ/Δ modulator 76 and other digital circuits operating on the rising edges to minimize the noises and disturbances.

Figure 8:
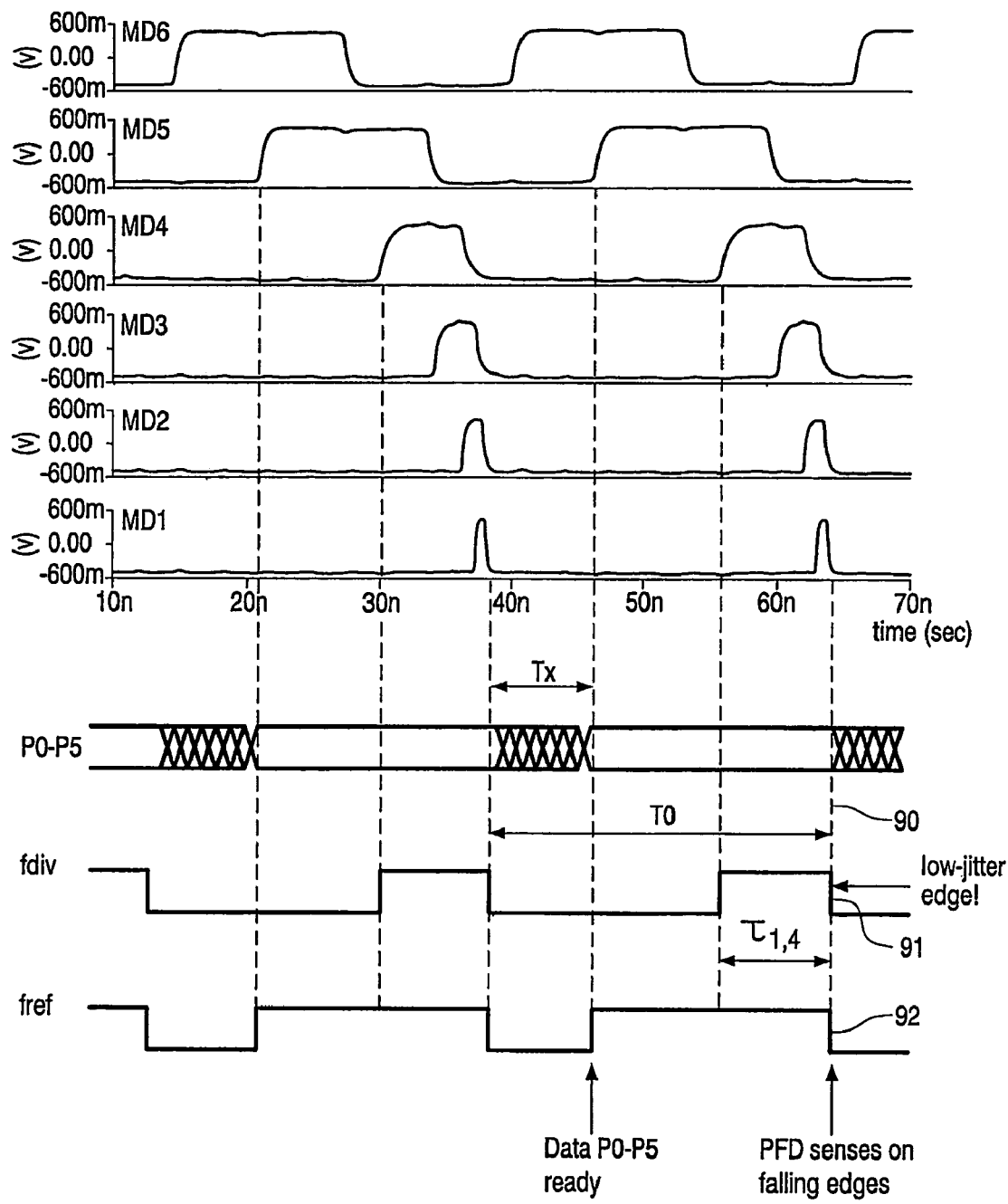
FIG. 8 is a diagram depicting the signals of the zipper divider of FIG. 7.

Based on the previous discussion on the timing constraint for Pi, the required location of the rising edge of fref can be deduced, as shown in FIG. 8. Therefore, the minimum duty cycle of fref must be larger than 50%. Quantitatively, one can express the required duty cycle Ω as $$\Omega = (To - Tx)/To = 47/\gamma.$$

The required duty cycle Ω depends on the division ratio γ. For $\gamma = \gamma_{min} = 64$, the duty cycle according to this equation has to be larger than 73.44%. This situation is shown in FIG. 8.

Figure 9:
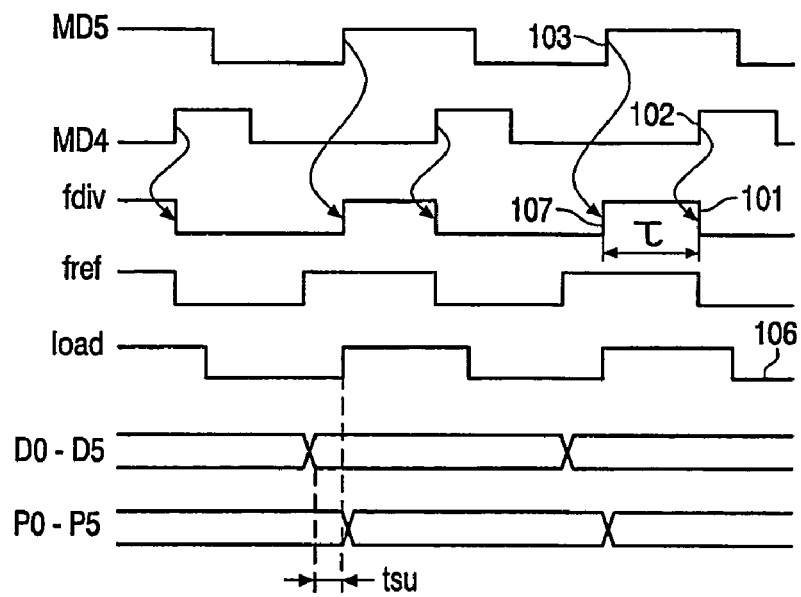
FIG. 9 is a diagram showing certain waveforms of one embodiment.

Because 50% duty cycle is used in virtually almost all applications, exotic duty cycles other than 50% have to be avoided, if possible. It has been found out that to allow a reference clock fref with 50% duty cycle the falling edge 91 of the signal fdiv has to be repositioned somewhere close to the rising edge of MD4. For this reason, the output pulse of fdiv can no longer be generated as proposed above in order to maintain 50% duty cycle for the reference clock fref, and to clock the control data Pi on the rising edges out of the Σ/Δ modulator 76. However, one can derive the falling edge 101 of the signal fdiv from the rising edge 102 of MD4, and the rising edge 103 from MD5, as illustrated in FIG. 9, thus yielding an output signal fdiv with a pulse width of $$\tau = \tau_{1,5} - \tau_{1,4} = 24/(fref\gamma).$$

Again, the pulse width is dependent on the division ratio. The available minimum pulse width now is 7.268 ns for fref=26 MHz and the maximum division ratio of 127.

With the above embodiment, the required minimum pulse width and 50% duty cycle for the reference clock fref have all been met. Unfortunately, the benefit of low level of phase noise offered by the fractional-N PLL transmitter 70 is ruined because the signal MD4 contains jitter that is too large.

A circuit to eliminate these jitters has been proposed in the above-mentioned co-pending patent application entitled "Improved frequency divider with reduced jitter and apparatus based thereon". A circuit in accordance with this co-pending patent application can be combined with the embodiments presented herein.

Figure 10:
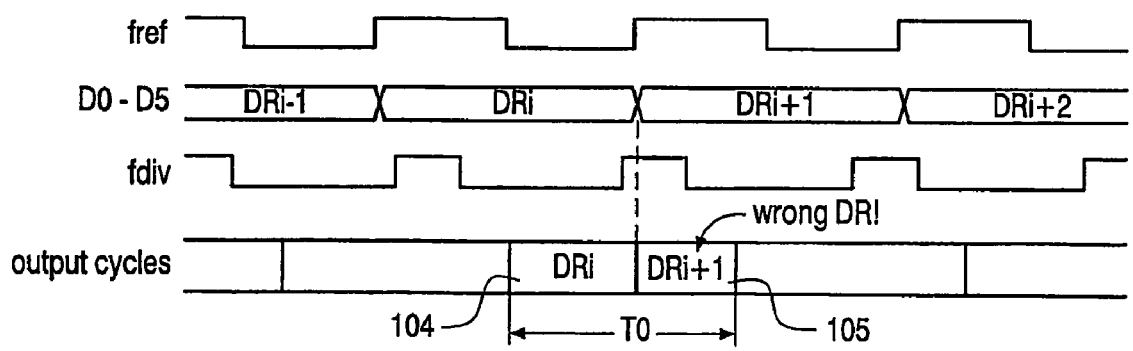
FIG. 10 is a diagram showing possible scenarios of misalignment.

Misalignment is a potential problem between the control bits Pi and the divided output cycle of fdiv, leading to a wrong VCO frequency fvco at the output 83, and more severely, it may even lead to a scenario that the PLL never be locked. Prior to the locked state, the signals fref and fdiv have different frequencies and phases. Because the control bits Pi are clocked out at the rising edges and because of the fractional-N division, it might happen during the acquisition process that the control bits Pi are misaligned with the output cycle of the signal fdiv of the zipper divider 77, as illustrated in FIG. 10, leading to a serious situation in which within one output cycle To two consecutive division ratios are accidentally applied to the zipper divider 77. As a result, within this cycle To the zipper divider 77 divides by these two different division ratios: first part by division ratio i 104 and the rest by division ratio i+1 105.

Clearly, this should be prevented from happening.

A simple method to solve this problem with two different division ratios is to add an n-bit input latch/dFF, and let it be clocked by a signal being synchronized with the divider output fdiv rather than fref. This clocking signal is designated as load signal 106 in FIGS. 9 and 11, derived directly from MD5. Data Di coming from the Σ/Δ modulator 76 are clocked out of the input latch/dFF, here as Pi, on the rising edge of the signal load 106.

For proper operation, the set-up time tsu and hold time of the used input latch/dFF has to be respected. As the proposed solution in FIG. 9 allows 50% duty cycle for fref, the available set-up time is given by $tsu=(\gamma/2-24)/(fref\gamma)$, which is again division ratio dependent. The minimum available set-up time tsu is obtained when the frequency divider 77 divides by its minimum division ratio, which is 76 for this embodiment. For fref=26 MHz one gets 7.1 ns indicating more than enough margin. The available hold time is equal to To-tsu, which is so long that it does not cause any concern.

The fractional-N division ratio has several implications. In the above discussions a constant division ratio was assumed. For a fractional-N PLL, however, the required division ratio, which is under the control of the Σ/Δ modulator 76, keeps changing. In worst case the division ratio may change once every output cycle To. Because a timing analysis for all possible division ratio combinations is quite complex and tedious, and even impossible due to the pressure of time-to-market, a detailed analysis is avoided.

Instead, the following approach has been adopted. First, one assumes a constant division ratio, as was done above, and tries to make the initial design to have as much margin as possible. Then, one checks the designed frequency divider 77 within a PLL under the worst case by simulation. The frequency divider 77 may cover all possible division ratios and the division ratio changes once every output cycle. One has to check and make sure that every cycle the designed frequency divider indeed divides the set division ratio.

Figure 11:
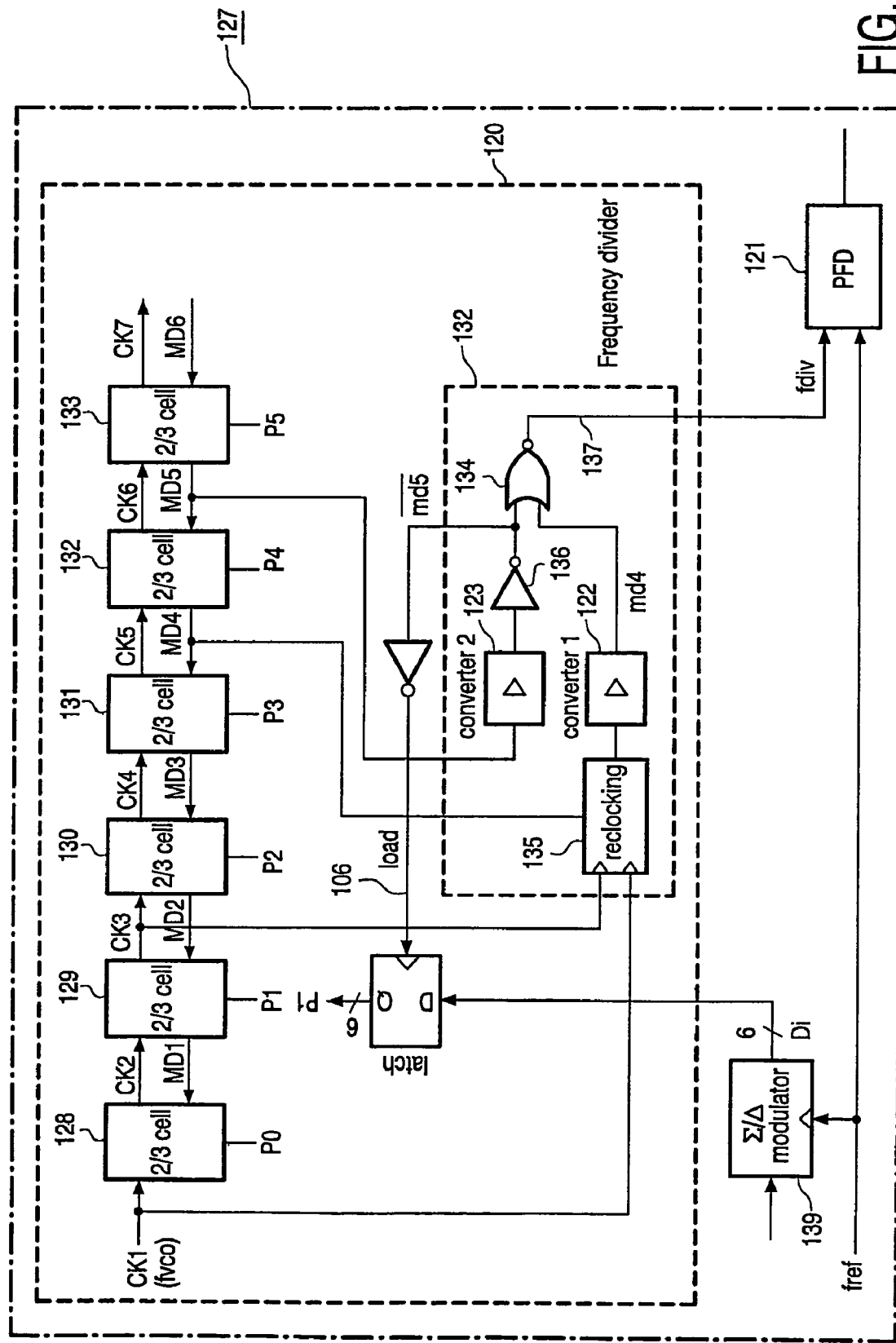
FIG. 11 is a schematic representation of part of a fractional-N PLL transmitter with a logic network according to the present invention.

Another frequency divider 120, according to the present invention, is depicted in FIG. 11. This embodiment is based on the timing diagram of FIG. 9. In the present embodiment, the logic network 138 for combining several of the mode control signals MDi comprises a plurality of elements/components. Because in most cases PDF 121 is made of full-swing logic dFFs, the logic network 138 comprises two converters 122, 123 as an interface to convert the small and differential MDi signals into full swing (rail-to-rail) signals. The first converter 123 is followed by an inverter 136 to invert the signal at MD5. Furthermore, the logic network 138 comprises a reclocking unit 135 that is clocked by the signals CK3 and fvco, and an XOR-gate 134. The output signal fdiv is provided at the output of the NOR-gate 134. The signal fdiv is generated in a manner that the rising edge 103 of MD5 provides for the rising edge 107 of fdiv and the rising edge 102 of MD4 provides for the falling edge 101 of fdiv. Further details concerning the reclocking technique applied in the present embodiment can be found in the co-pending patent application entitled "Improved frequency divider with reduced jitter and apparatus based thereon".

Figure 12:
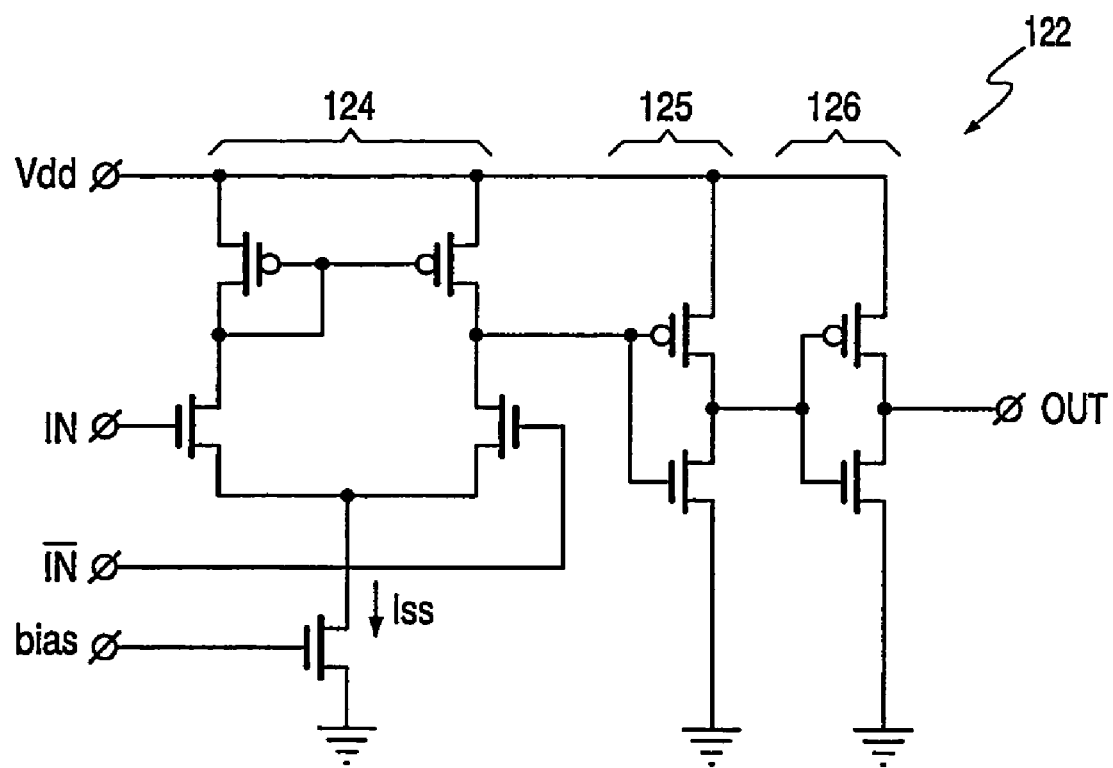
FIG. 12 is a schematic representation of a converter, according to the present invention.

A simple realization of such a converter 122 is given in FIG. 12. The converter 122 comprises of a one-stage operational amplifier 124 followed by two inverters 125 and 126. Because only the jitters of converter 122 are critical to the phase noise of this PLL transmitter 127, the current consumption of the converter 123 can be reduced, indicated by a smaller sign of a triangle in FIG. 11.

It must be pointed out that the proposed architecture can be applied to zipper dividers with any number of cells without exception.

The present invention is suited for use in communication systems and other system. The present invention is suited for use in transmitters and receivers. The invention is particularly well suited for use in one-chip CMOS transceivers. Systems in accordance with the present invention can be employed in cellular phones (GSM or UMTS, for example), DECT hand sets, personal communication systems, Bluetooth devices, just to mention a few examples.

A frequency divider in accordance with the present invention can be combined with other circuits in order to realize power efficient implementations of transceivers, radio frequency (RF) integrated circuits (ICs), GSM solutions, DECT devices, PCS, and Bluetooth solutions.

It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable subcombination.

In the drawings and specification there has been set forth preferred embodiments of the invention and, although specific terms are used, the description thus given uses terminology in a generic and descriptive sense only and not for purposes of limitation.

The invention claimed is:

1. Apparatus for generating an output signal whose frequency is lower than the frequency of an input signal, the apparatus comprising:
   a chain of frequency dividing cells, wherein each of the frequency dividing cells has a definable division ratio and comprises
   a clock input for receiving an input clock,
   a divided clock output for providing an output clock to a subsequent frequency dividing cell,
   a mode control input for receiving a mode control input signal from the subsequent frequency dividing cell, and
   a mode control output for providing a mode control output signal to a preceding frequency dividing cell; and
   a logic network having plural inputs and an output, the plural inputs being m in number and being connected to m mode control inputs such that each one of said m inputs is connected to a respective one of m frequency dividing cells and such that the m inputs receive the m frequency dividing cells' mode control input signals, and the logic network providing at the output an output signal having a pulse width responsive to a combination of the pulse widths of the received mode control input signals.

2. The apparatus of claim 1, wherein each one of said m inputs is connected to a respective one of m frequency dividing cells and the logic network combines the mode control input signals such that the rising edge of the output signal is set responsive to an edge of a selected mode control input signal, and the falling edge of the output signal is set responsive to an edge of another selected mode control input signal.

3. The apparatus of claim 1, wherein each one of said m inputs is connected to a respective one of m consecutive freguency dividing cells and the logic network comprises an OR-gate or an NOR-gate.

4. The apparatus of claim 2, wherein the logic network combines the received mode control input signals such that the rising edge of the output signal is set responsive to the rising edge of a selected mode control input signal, and the falling edge of the output signal is set responsive to the rising edge of another selected mode control input signal.

5. The apparatus of claim 2, wherein each one of said m inputs is connected to a respective one of m consecutive freguency dividing cells.

6. The apparatus of claim 2, the rising edge of the output signal is set responsive to the rising edge of a selected mode control input signal, and the falling edge of the output signal is set responsive to the falling edge of another selected mode control input signal.

7. The apparatus of claim 1, wherein the logic network provides the output signal so as to have a pulse width that is wider than the widest pulse width of any of the received mode control input signals.

8. The apparatus of claim 1, wherein each frequency dividing cell of the chain of frequency dividing cells comprises a programming input for application of a binary code word allowing together with the mode control input signals the division ratio of the frequency dividing cells to be switched.

9. The apparatus of claim 1, wherein at least selected of the m frequency dividing cells of the chain of frequency dividing cells comprise a zipper divider architecture, whereby the received mode control input signals associated with these selected frequency dividing cells have a common freguency.

10. The apparatus of claim 1, wherein the frequency dividing cells are divide-by-2/3 cells, wherein the division ratio can be switched between 2 and 3.

11. The apparatus of claim 1, wherein the logic network combines consecutive mode control input signals so as provide an output signal having a pulse width responsive to the calculus:

$$\tau = \tau_{(x,y)} - \tau_{(x, y-1)}$$

where τ refers to pulse width, and x, y–1 and y reference, respectively, initial, penultimate and ultimate mode control signals.

12. The apparatus of claim 1, wherein each frequency dividing cell further comprises a programming input for application of a control signal, the control signal providing, together with the respective mode control input signal, for programming of the division ratio of the frequency dividing cell; and further comprising an input latch which supplies the control signal, the input latch being clocked by a signal synchronized with the output signal of the logic network.

13. The apparatus of claim 1, wherein the logic network further comprises one or more converters, the converters coupled to receive the m mode control inputs so as to convert such signals for compliance with interfacing criteria of the output.

14. The apparatus of claim 1, wherein the logic network further comprises a reclocking unit, the reclocking unit being clocked by selected clock inputs and divided clock outputs associated with one or more frequency dividing cells.

15. Apparatus for generating an output signal whose frequency is lower than the frequency of an input signal, the apparatus comprising:
   a chain of frequency dividing cells, wherein each of the frequency dividing cells has a definable division ratio and comprises
   a clock input for receiving an input clock,
   a divided clock output for providing an output clock to a subsequent frequency dividing cell,
   a mode control input for receiving a mode control input signal from the subsequent frequency dividing cell, and a mode control output for providing a mode control output signal to a preceding frequency dividing cell; and a logic network having plural inputs, the plural inputs being m in number and being connected to m mode control inputs such that each one of said m inputs is connected to a respective one of m consecutive frequency dividing cells and such that the m inputs receive the m frequency dividing cells' mode control input signals, the logic network making an output signal available at an output of the logic network, the output signal having a pulse width that is wider than the widest pulse width of any of the mode control input signals at the m inputs of the logic network, wherein the logic network is designed such that the rising edge of a signal at a first mode control input of one of the m consecutive frequency dividing cells triggers the rising edge of the output signal, and the rising edge of a signal at a second mode control input of one of the m consecutive frequency dividing cells triggers the falling edge of the output signal.

16. Apparatus for generating an output signal whose frequency is lower than the frequency of an input signal, the apparatus comprising:

a chain of frequency dividing cells, wherein each of the frequency dividing cells has a definable division ratio and comprises a clock input for receiving an input clock, a divided clock output for providing an output clock to a subsequent frequency dividing cell, a mode control input for receiving a mode control input signal from the subsequent frequency dividing cell, and a mode control output for providing a mode control output signal to a preceding frequency dividing cell; and a logic network having plural inputs, the plural inputs being m in number and being connected to m mode control inputs such that each one of said m inputs is connected to a respective one of m consecutive frequency dividing cells and such that the m inputs receive the m frequency dividing cells' mode control input signals, the logic network making an output signal available at an output of the logic network, the output signal having a pulse width that is wider than the widest pulse width of any of the mode control input signals at the m inputs of the logic network, wherein the logic network comprises converters, an inverter, a reclocking unit, and an NOR-gate.

* * * * *